United States Patent [19]

Nakayama et al.

[11] Patent Number: 4,937,205

[45] Date of Patent: Jun. 26, 1990

[54] PLASMA DOPING PROCESS AND APPARATUS THEREFOR

[75] Inventors: Ichiro Nakayama, Kadoma; Bunji Mizuno, Ikoma; Masabumi Kubota, Osaka; Masuo Tanno, Hirakata, all of Japan

[73] Assignee: Matsushita Electric Industrial Co., Ltd., Kadoma, Japan

[21] Appl. No.: 228,216

[22] Filed: Aug. 4, 1988

[30] Foreign Application Priority Data

Aug. 5, 1987 [JP] Japan ................................. 62-195911
Nov. 27, 1987 [JP] Japan ................................. 62-299241

[51] Int. Cl.$^5$ ........................................ H01L 21/76
[52] U.S. Cl. .................................. 437/165; 437/172; 427/38; 427/39
[58] Field of Search ................ 437/165, 171, 172, 87, 437/17, 20, 937; 148/DIG. 79, DIG. 40; 427/38, 39

[56] References Cited

U.S. PATENT DOCUMENTS

| 4,382,099 | 5/1983 | Legge et al. ......................... 437/165 |
| 4,385,946 | 5/1983 | Finegan et al. ...................... 437/105 |
| 4,434,036 | 2/1984 | Hoerschelmann et al. .......... 437/81 |
| 4,465,529 | 8/1984 | Arima et al. ......................... 437/165 |
| 4,481,229 | 11/1984 | Suzuki et al. ...................... 427/38 |
| 4,500,563 | 2/1985 | Ellenberger et al. ................. 427/38 |
| 4,521,441 | 6/1985 | Flowers .............................. 437/161 |
| 4,539,217 | 9/1985 | Farley ................................. 427/38 |
| 4,565,588 | 1/1986 | Seki et al. ........................... 437/161 |
| 4,698,104 | 10/1987 | Barkers et al. ..................... 437/141 |
| 4,764,394 | 8/1988 | Conrad ............................... 427/39 |

FOREIGN PATENT DOCUMENTS

| 0086214 | 5/1984 | Japan ................................. 437/101 |
| 0218728 | 12/1984 | Japan ................................. 437/165 |
| 0120041 | 6/1987 | Japan ................................. 437/165 |

Primary Examiner—Brian E. Hearn
Assistant Examiner—Tuan Nguyen
Attorney, Agent, or Firm—Cushman, Darby & Cushman

[57] ABSTRACT

In a plasma doping process utilizing a radio frequency discharging in a vacuum by for doping an impurity into a semiconductor substrate, the radio frequency discharging is made intermittently and under controlling of average current of the discharging, thereby the impurity concentration is desirably controlled; and especially by selecting the vacuum in a range between $1 \times 10^{-4} - 5 \times 10^{-2}$ torr, undesirable deposition of the impurity on the substrate surface is evadable.

14 Claims, 8 Drawing Sheets

PLASMA DOPING PROCESS AND APPARATUS THEREFOR

FIELD OF THE INVENTION AND RELATED ART STATEMENT

1. FIELD OF THE INVENTION

The present invention relates to a plasma doping method and apparatus therefor, for introducing impurities into a substrate, especially of a semiconductor such as silicon, by plasma irradiation generated by radio frequency discharging.

2. DESCRIPTION OF THE RELATED ART

In recent years accompanying miniaturization of semiconductor devices and high integration and resultant increased step of manufacturing, many technologies of impurity introduction into semiconductor substrate have been developed. One technology is thermal impurity diffusion process, wherein a glass of boron, arsenide or phosphor is deposit-formed on the surface of the substrate and thereafter the substrate is heated for a predetermined time period to cause a thermal diffusion. Another method is ion-implantation process wherein the impurity is ionized and accelerated by a voltage of from several ten KV to several MV, thereby to implant the impurities into the substrate.

Among these processes, in manufacturing source and drain electrodes of MOS transistors, the ionimplantation process is widely used. On the other hand in the process of forming the source-drain regions in IC devices, more and more shallow configuration of junctions become necessary as a result of miniaturization of the integrated circuits. However, in the present day ionimplantation art, there is a problem that the impurity is liable to be implanted deeper than intended ideal depth, even when a relatively small energies such as several ten KV are utilized.

Other problem is that, in the thermal diffusion of impurity from glass of boron, arsenide or phosphor, for doping into polycrystalline silicon layer or the like, to make gate electrodes of MOS transistor, three steps are necessary, namely (i) deposition of glass, (ii) thermal treatment and (iii) removing of the glass. Besides, the thermal diffusion process has a further problems that doping only to a very local minute region is diffucult because the glass of impurity is deposited on the whole surface of the substrate, the doping amount on the polycrystalline silicon is liable to become too much, and the temperature control in the heat treatment is difficult.

Furthermore, as the pattern on the device becomes finer and finer, it becomes popular to make capacitors on the MOS transistor by making a deep trench on the surface of the silicon layer wherein vertical side faces (inside walls of the trench) are used as electrodes of the capacitors. And oblique ion-implantation to make doping on the vertical side face of the trench is liable to result in making impurity-depletion region at the lower part of the side walls because the upper part of the trench make masking effect. On the other hand, if the inclination angle of the oblique ion-implantation is selected small in order to prevent the making of the impurity depletion region, reflection of ions on the side wall of the trench increases. And hence the impurity concentration controlling becomes very difficult (see e.g. G. Fuse, "Journal of Electrochemical Soc." 133-996 (1986). When a rotation implantation is adopted to uniformly implant the impurities into the whole walls of the trenches, the steps and device therefor rotation of the substrate must be added in manufacturing process and apparatus, and hence cost increases.

In order to solve the above-mentioned problems, and to fulfill needs of the recent semiconductor technology, plasma doping process has been proposed (for a instance, see unexamined published patent application sho 56-138921). The plasma doping process of the prior art disclosed in the unexamined published patent application sho 56-138921 is elucidated with reference to the accompanying FIG. 8. A vacuum chamber 3 has a lower electrode 1 wherein an object substrate 4, for instance, a Si substrate is to be supported and an upper electrode 2, and $PH_3$ gas is introduced from the inlet port 5 into the inside space of the vacuum chamber 3 at a flow rate of 20 SCCM, and evacuation is made from the output port 6. And the pressure of the $PH_3$ gas in the vacuum chamber 3 is controlled to be at 0.1 torr. Then across the lower electrode 1 and the upper electrode 2 a radio frequency voltage of 13.56 MHz and 300 W is impressed from an R. F. power source 7. Thereby, a plasma discharging in the $PH_3$ gas in the vacuum chamber 3 is carried out, thereby to dope impurity doping on the silicon substrate 4.

The above-mentioned plasma doping in the prior art has a problem that an ion current is not measured during the radio frequency discharging, and hence, accurate controlling of the impurity doping amount is difficult.

In a low vacuum range, e.g. $5 \times 10^{-2}$–5 torr of conventional dry etching apparatus, wherein generally stable discharging is obtainable, the impurity is deposited on the surface of the Si substrate 4, and a very high amount of impurity concentration (e.g. about $10^{23}$ atoms/$cm^3$ of B) is deposited within a very short time. Therefore, in order to accurately obtain an intended accurate doping amount (e.g. about $10^{16}$–$10^{17}$ atoms/$cm^3$ of B, or $10^{18}$–$10^{19}$ atoms/$cm^3$ of As or P, which is lower than the above-mentioned deposited amount of $10^{23}$ atoms/$cm^3$), it is much difficult to deposit such lower amount of atoms by the method of shortening the time of discharging. If the substrate temperature were raised (e.g. to 300°) in order to prevent the undesirable deposition of the impurity on the surface of the substrate, the presently employed photoresist processes in making the source-drain configuration of the MOS-LSI could not be utilized.

As discussed above, the conventional plasma doping method has the problem that the concentration of the doped impurity can not be controlled.

OBJECT AND SUMMARY OF THE INVENTION

The purpose of the present invention is to provide a plasma doping process and apparatus therefor for enabling accurate controlling of impurity concentration during the doping process.

In order to achieve the above-mentioned purpose, a radio frequency discharging is made intermittently in the vacuum chamber.

Method for plasma-doping of impurity on a semiconductor substrate comprising the steps of:
placing an object semiconductor substrate on a first electrode in a vacuum chamber,
introducing a gas of a controlled reduced pressure containing at least one impurity, into the vacuum chamber, and
impressing a radio frequency current of a high voltage in intermittence across the first electrode and a second electrode in the chamber thereby making radio frequency discharging in the chamber, to generate a plasma doping.

According to the present invention, a desired impurity layer can be formed in the surface part of the objective substrate, with a desired depth and with accurate impurity concentration, by carrying out the intermittent radio frequency discharging, by accurately controlling the current. By controlling of the gas pressure in the vacuum chamber to be between $1\times10^{-4}$ and $5\times10^{-2}$ torr, undesirable deposition of impurity on the substrate surface is prevented, and impurity doping of very low concentration can be made accurately.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Hereafter the present invention is elucidated in detail with reference to the accompanying figures of FIG. 1 through FIG. 7 whereby the preferred embodiments are shown.

EMBODIMENT 1

Figure 1:
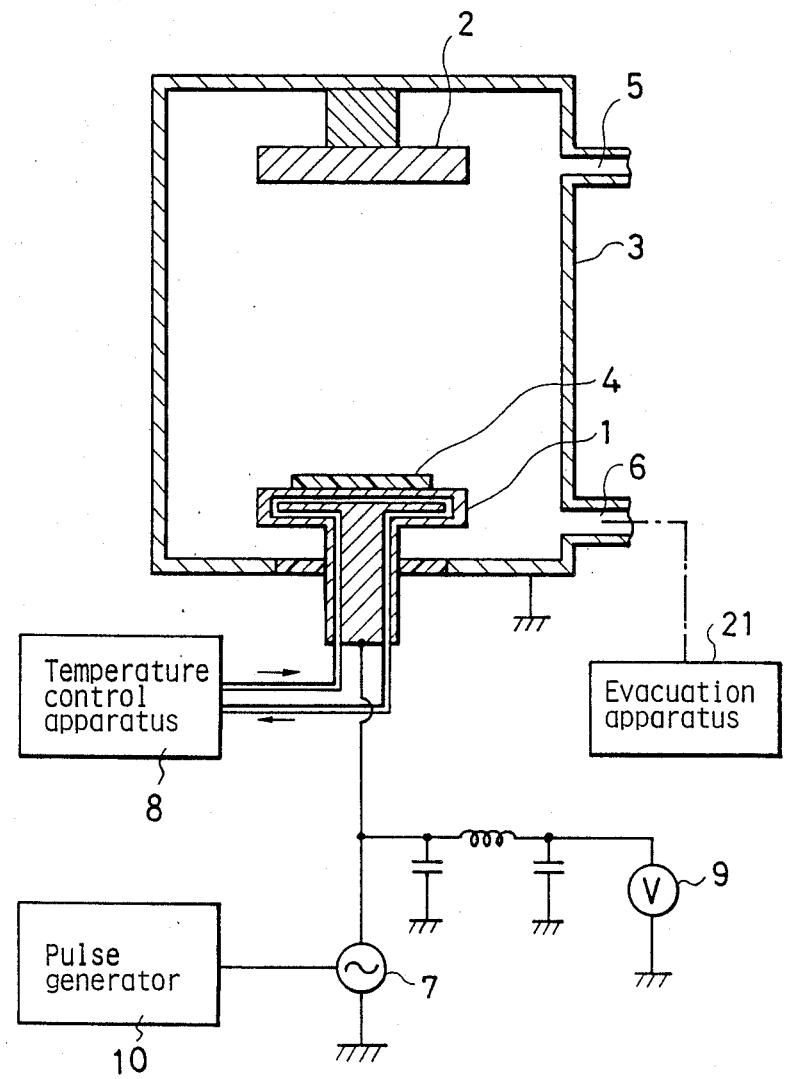
FIG. 1 is a sectional view showing configuration of the plasma doping apparatus of the first embodiment of the invention.

A first preferred embodiment of the present invention is elucidated hereafter with reference to FIG. 1.

A vacuum chamber 3 has a gas inlet port 5, and a gas evacuation port 6, whereto a known evacuation apparatus 21 is connected and comprises an upper electrode 2 and a lower electrode 1 therein. The lower electrode 1 is for supporting thereon an object substrate 4, for instance, a Si substrate of 6 inch diameter, and is thermally connected to a known temperature control apparatus 8, so that the temperature of the lower electrode 1 is controlled to be always at a constant temperature e.g. 20° C. The lower electrode 1 is further connected to an R. F. power source 7, which issues a radio frequency current of, for instance, 13.56 MHz. A volt meter 9 for measuring D.C. potential of the lower electrode 1 is connected through a known low-pass filter to the lower electrode 1. The radio frequency oscillator 14 is modulated by a pulse-generator so as to have a desired controlled pause time period intermittently.

The operation of the plasma doping in the above-mentioned apparatus is as follows:

Mixed gas containing 95 vol % of He and 5 vol % of $B_2H_6$ wherein boron (B) is impurity to be doped, is lead into the vacuum chamber 3, through the gas-inlet port 5, at a rate of 10 sccm. The inside of the vacuum chamber 3 is kept at about $2\times10^{-3}$ torr, and the R. F. power of about $-700$ V by the volt-meter 15 is fed across the lower electrode 1 and the upper electrode 2, intermittently by the pulse-modulation, which is made by the output pulse of the pulse generator 10, thereby to make discharging in the vacuum chamber 3. By controlling the duty ratio determined by respective oscillation periods and pause periods, the surface temperature of the Si substrate 4 is controlled to be 120° C. as a result of thermal equibrium of heat produced by discharge and conduction to 20° C. cooled electrode 11. And the discharging of the radio frequency current is carried out so that the total discharge time becomes 100 sec..

Figure 2:
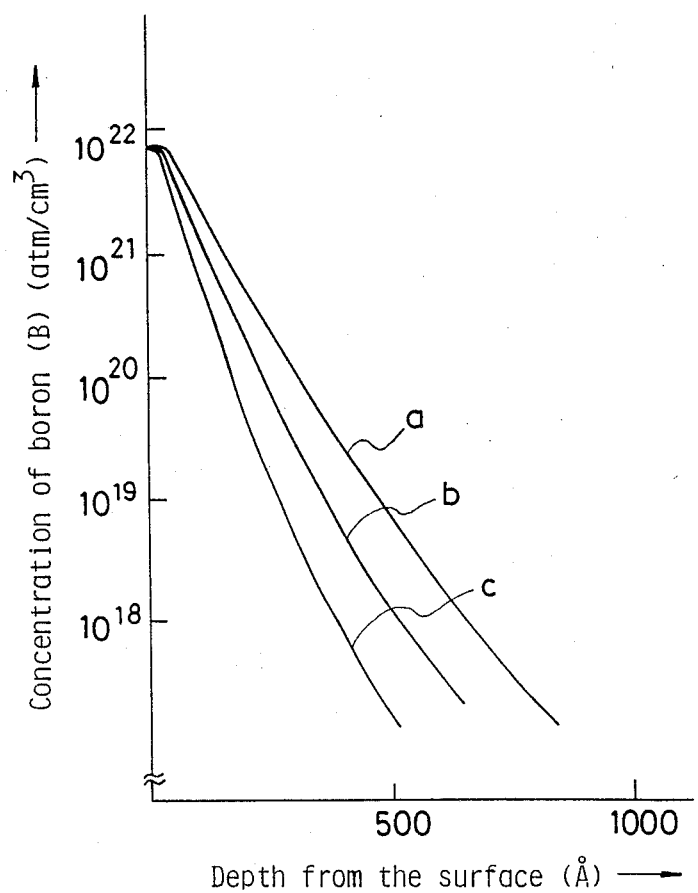
FIG. 2 is characteristic chart showing SIMS profile data of the first embodiment.

FIG. 2 is a graph of SIMS (Secondary Ion Mass Spectorometer) analysis data, wherein curve "a" shows an impurity doped layer obtained in the above-mentioned doping process carried out retaining the substrate temperature at 120° C. The curve "a" shows that the surface part of the substrate has concentration of boron (B) of about $1\times10^{21}$ cm$^{-3}$.

Curves "b" and "c" are for the cases carried out under lower substrate temperatures. Curve "b" shows the case wherein surface temperature of the Si-substrate 13 is retained at 100° C. and the total discharge period is also 100 sec.. Curve "c" shows the case wherein the surface temperature of the Si-substrate 13 is kept at 80° C. and the total discharge period is also 100 sec.. The graph indicates that, as the higher the surface temperature of the Si-substrate during the discharging is, the deeper the impurity doping is made.

As has been described in the above-mentioned embodiment, impurity concentration profile of the plasma doping is adjustable by controlling the surface temperature of the Si-substrate through control of duty ratio of the intermittent radio frequency discharging in the chamber. Therefore a uniform impurity layer can be formed on the Si-substrate.

The photoresist film used as mask is not denatured by the doping.

As a modified embodiment, the narrow-gapped deep trench made in accordance with the present invention is used as isolation trench for isolation of indivisual elements in an IC.

EMBODIMENT 2

A second preferred embodiment of the present invention is elucidated hereafter with reference to FIG. 1. An apparatus used in this embodiment 2 is the same as the one used in the embodiment 1. Therefore, the same description as the first embodiment apply unless the differences mentioned below. The size of the object substrate 4, for instance, a Si substrate is 6 inch in diameter the same as the embodiment 1 and the temperature of the lower electrode 1 also controlled to be always at a constant temperature e.g. 20° C.

The operation of the plasma doping in the apparatus is as follows. Mixed gas containing 95 vol % of He and 5 vol % of $B_2H_6$ wherein boron (B) is an impurity to be doped, is lead into the vacuum chamber 3, through the gas-inlet port 5, at a rate of 10 sccm. The inside of the vacuum chamber 3 is kept at about $1\times10^{-3}$ torr, and the R. F. power of about $-700$ V by the volt-meter 15 which measures DC potential of the lower electrode 1 is fed (across the lower electrode 1 and the upper electrode 2), intermittently by the pulse modulation, which is made by the output pulse of the pulse generator 10, thereby to make discharging in the vacuum chamber 3. Under the condition that the total discharge time is 100 sec., the frequency of the pulse generator 10 is changed from 0.01 Hz to 100 Hz.

The sheet resistance of Si substrate 1 obtained in the above-mentioned discharging is measured.

Figure 3:
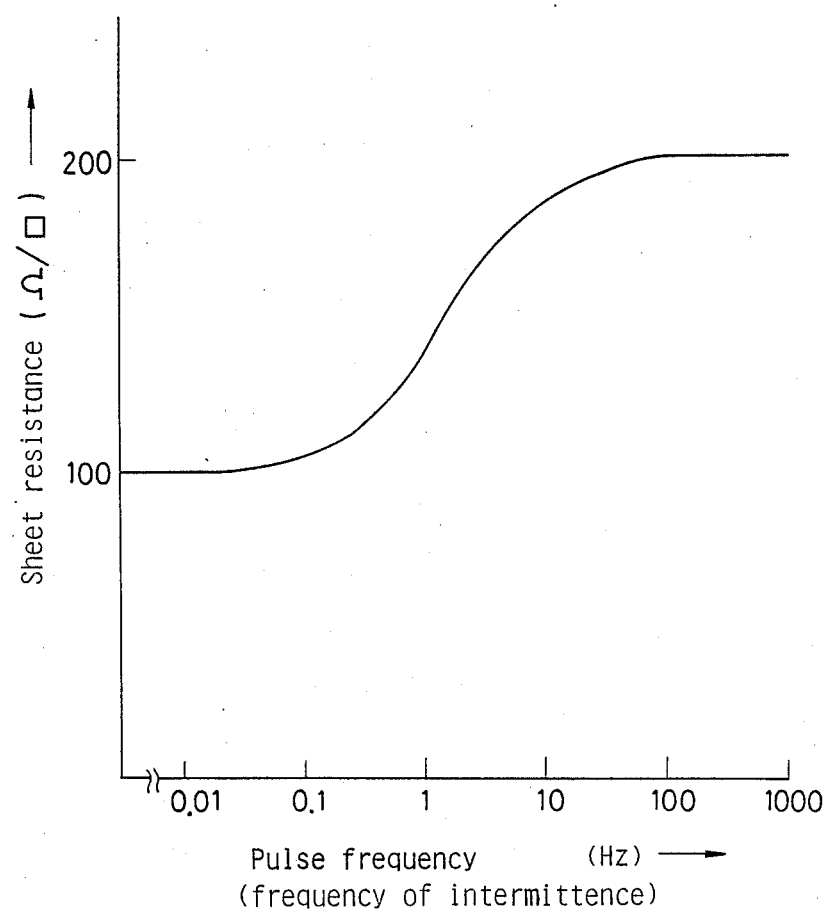
FIG. 3 is a graph showing relation between sheet resistance and pulse frequency (frequency of intermittence) in the second embodiment of the present invention.

FIG. 3 is a graph of sheet resistance of the Si substrate 4. Additionally the sheet resistance of Si substrate 4 is measured after annealing at 1000° C., in $N_2$ for 30 minutes.

A curve shows that when the frequency of intermittence i.e. frequency switchings between pause and radio frequency discharging is less than about 0.1 Hz (including continuous discharging) the sheet resistance is constant at about 100Ω: but when the frequency of switching between pause and radio frequency discharging is in the range of 0.1–50 Hz, the resistance is increasing from 100Ω to 200Ω; and when the frequency is higher than 50 Hz, the resisting becomes constant at about 200 Ω.

As has been described in the above-mentioned second embodiment, impurity concentration profile of the plasma doping is adjustable by changing the frequency of intermittence of the radio frequency discharging from 0.1 Hz to 50 Hz.

In this embodiment, the duty ratio of 50% (wherein respective pause time periods and discharging time periods are of equal length) is chosen. Even if other duty ratio is chosen, the characteristics that the sheet resistance changes corresponding to the frequency of the pause-oscillation alternation.

EMBODIMENT 3

Figure 4:
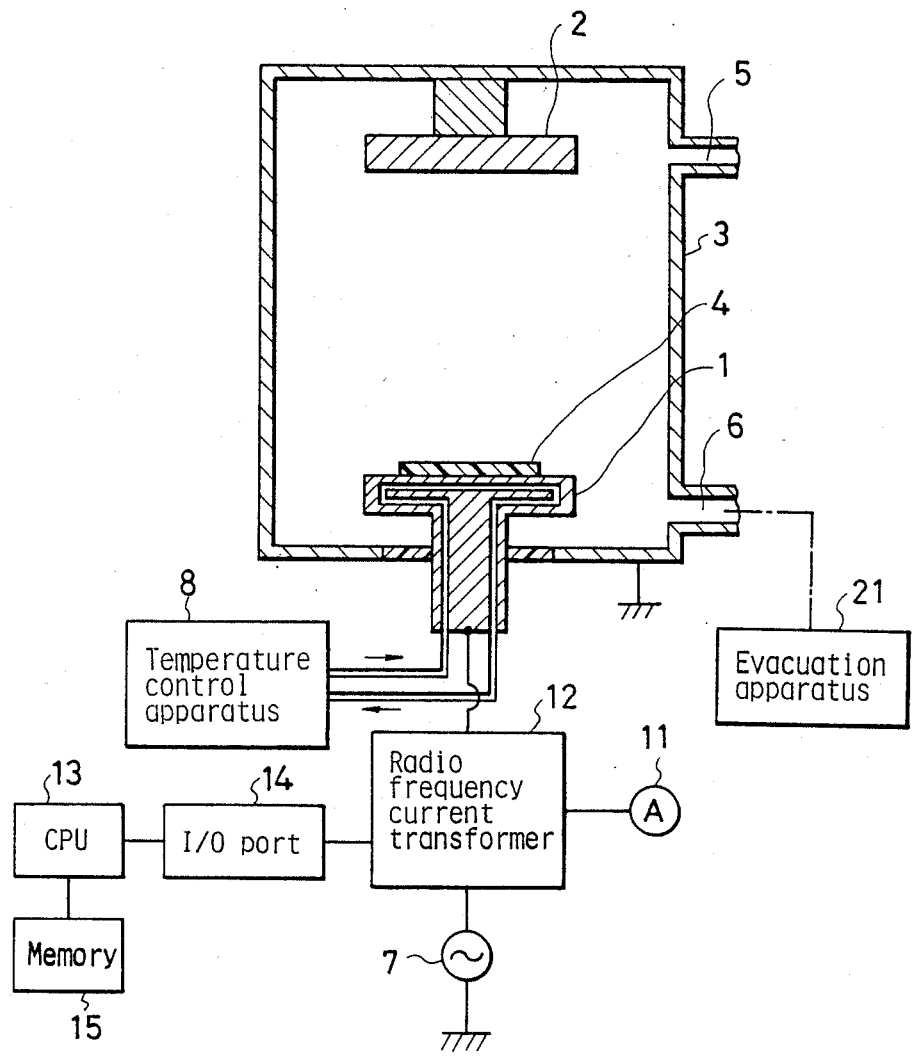
FIG. 4 is a sectional view showing a plasma doping apparatus of a third embodiment of the present invention.

A third preferred embodiment of the present invention is elucidated hereafter with reference of FIG. 4. An apparatus used in this embodiment 3 is the same as the one used in the embodiment 1. Therefore, the same description as the first embodiment apply unless the differences mentioned below.

A vacuum chamber 3 has an inlet port 5, an outlet port 6, and comprises an upper electrode 2 and a lower electrode 1 therein. The lower electrode 1 is for supporting thereon the object substrate 4, for instance, a Si substrate and is thermally connected to a known temperature control apparatus 8, so that the temperature of the lower electrode 1 is controlled to be always at a constant temperature e.g. 20° C. The lower electrode 1 is further connected to an R. F. power source 7, which issues a radio frequency current of, for instance, 13.56 MHz. An ampere meter 11 is for measuring the discharging current through a radio frequency current transformer 12. And a known CPU (Central Processing Unit) 13 is connected through a known I/O port (Input-/Output Port) 14 to the radio frequency current transformer 12. And a known memory 15 is connected to the CPU 13.

Figure 5:
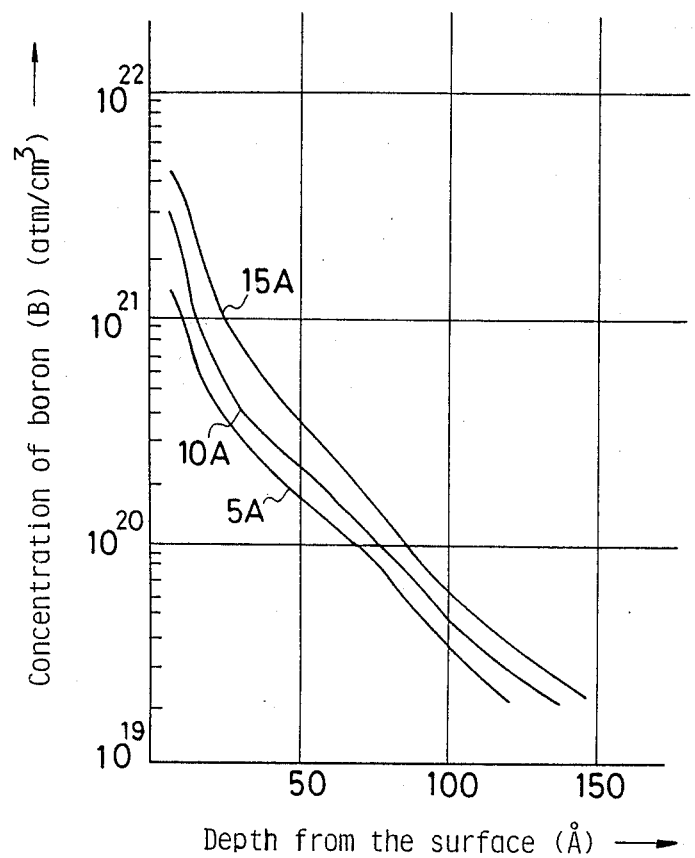
FIG. 5 is a characteristic chart showing SIMS profile of the third embodiment.

The operation of the plasma doping in the above-mentioned apparatus is as follows: Mixed gas containing 95 vol % of He and 5 vol % of $B_2H_6$ wherein boron (B) is an impurity to be doped, is lead into the vacuum chamber 3, (through the gas-inlet port 5,) at a rate of 8 sccm. The inside of the vacuum chamber 3 is kept at about $1\times10^{-3}$ torr. The R. F. power from R. F. power source 7 is fed across the lower electrode 1 and the upper electrode 2, in a manner as follows: various R. F. currents of about 5A, 10A or 15A by the ammeter 23 are used and the discharge time is 100 sec for each cases. Then, the R. F. power inputs to the plasma doping apparatus are 150 W, 190 W or 260 W, respectively. It is found therefrom that the electric current of discharging is not in direct proportion to the R. F. power. And the current is automatically controlled through the instantaneous current and total time-integral value of current by the CPU 13. The CPU 13 operates with reference to a predetermined stored data and program in the memory 15. FIG. 5 is a graph of SIMS analysis data of atoms of boron which exist in the surface part of Si substrate 4 after discharging. FIG. 5 shows that: when the electric current of discharging is about 5A, the surface part of the substrate has concentration of boron (B) of about $1.5\times10^{21}$ cm$^{-3}$; when said current is 10A, said surface part has concentration of boron (B) of about $3.0\times10^{21}$ cm$^{-3}$; when said current is 15A, said surface part has concentration of boron (B) of about $4.5\times10^{21}$ cm$^{-3}$. These results shows that the concentration of boron (B) is in direct proportion to the electric current of discharging, while R. F. power is not direct proportion to concentration of boron (13). Accordingly only controlling the electric current can adjust concentration of boron (B). Besides, under the above-mentioned conditions: the concentration of boron is about $4.4\times10^{21}$ cm$^{-3}$ when the current of discharging i about 5A and the discharge time is 300 sec.. The concentration boron is about $4.5\times10^{21}$ cm$^{-3}$ when the current of discharging is about 15A and the discharge time is 100 sec.. And each case shows almost same concentration;

As has been described in the above-mentioned embodiment, impurity concentration profile of the plasma doping is adjustable by controlling the electric current of the R. F. power.

As a modified example, a combination of the radio frequency discharging and an ECR (Electron Cyclotron Resonance) discharging produces the similar results as the above-mentioned.

EMBODIMENT 4

Figure 6:
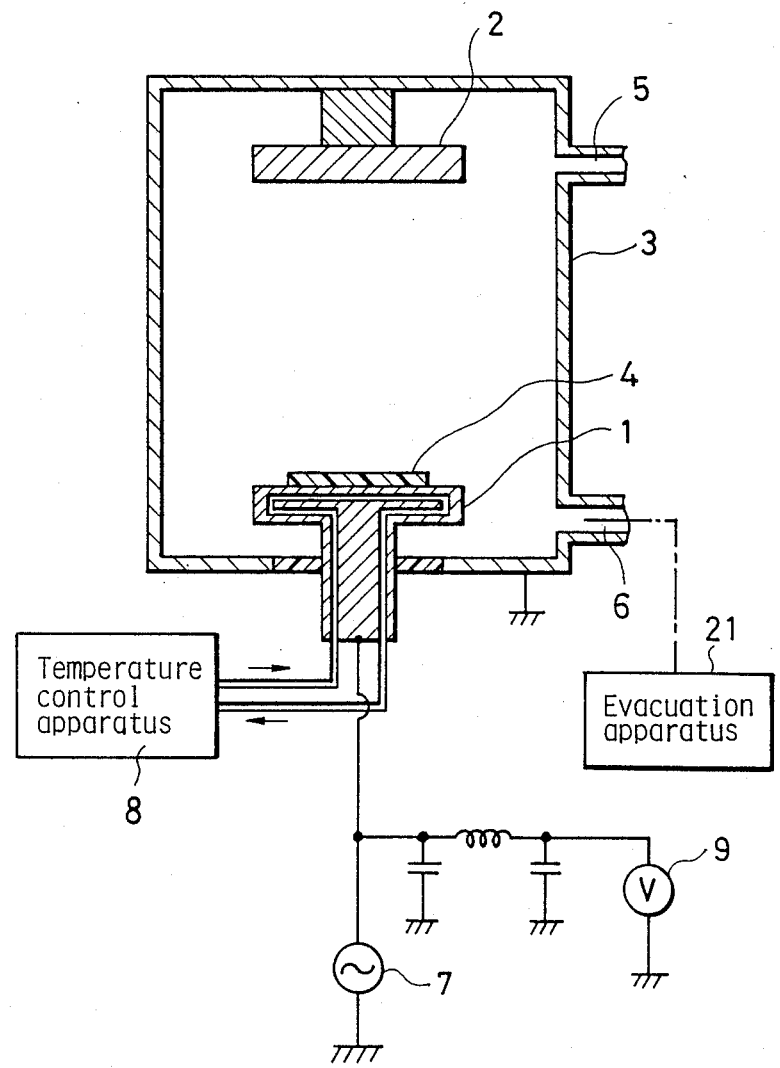
FIG. 6 is a sectional view showing a plasma doping apparatus of a fourth embodiment of the present invention.

A fourth preferred embodiment of the present invention is elucidated hereafter with reference to FIG. 6. An apparatus used in this embodiment 4 is the same as the one used in the embodiment 1. Therefore, the same description as the first embodiment apply unless the differences mentioned below.

A vacuum chamber 3 has a gas inlet port 5, and comprises an upper electrode 2 and a lower electrode 1 which is for supporting thereon the object substrate 4, for instance, a Si substrate of 6 inch in diameter, having deep trenches having width of pattern openings of 0.5 $\mu$m and depth of 3 $\mu$m. The lower electrode 1 thermally connected to a known temperature control apparatus 8, so that the temperature of the lower electrode 1 is controlled to be always at a constant temperture e.g. 20° C. The lower electrode 1 is further connected to an R. F. power source 7, which issue a radio frequency current of, for instance, 13.56 MHz. A volt meter 9 for measuring D.C. potential of the lower electrode 1 is connected through a known low-pass filter to the lower electrode 1.

The operation of the plasma doping in the above-mentioned apparatus is as follows:

mixed gas containing 95 vol % of He and 5 vol % of $B_2H_6$ wherein boron (B) is an impurity to be doped, is lead into the vacuum chamber 3, through the gas-inlet port 5 at a rate of 10 sccm.

Another example is that by keeping the inside of the vacuum chamber 3 is kept at about $2\times 10^{-3}$ torr, and the R. F. power of about $-700$ v by the volt-meter 34 is fed; across the lower electrode 1 and the upper electrode 2 in one example with discharging time of 10 sec., and another example with discharging time of 100 sec.. SIMS analysis data of samples as above-mentioned shows: the surface part of the substrate discharged for 10 sec. has concentration of boron (B) of about $1\times 10^{20}$ $cm^{-3}$, the surface part of the substrate discharged for 100 sec. has concentration of boron (B) of about $1\times 10^{21}$ $cm^{-3}$, and furthermore the deep part of the substrate has a uniform concentration of boron (B).

Another example is that by keeping the inside of the vacuum chamber 3 at about $2\times 10^{-2}$ torr, all other conditions are equal as above-mentioned. SIMS analysis data shows: the surface part of the substrate discharged for 10 sec. has concentration of boron (B) of about $2\times 10^{20} cm^3$; the surface part of the substrate discharged for 100 sec. has concentration of boron (B) of about $2\times 10^{21}$ $cm^3$; and furthermore the exposed surface formed in the deep trench has a uniform concentration of boron (B).

The above-mentioned two cases show that the concentration of boron (B) is in direct proportion to the discharging time, under the condition that the inside of the vacuum chamber 3 is kept at a constant pressure in the range of $2\times 10^{-3}$-$2\times 10^{-2}$ torr.

Another example is that the inside of the vacuum chamber 3 is kept at about $5\times 10^{-2}$ torr, and all other conditions are equal as above-mentioned. SIMS analysis data shows: the surface part of the substrate discharged for 10 sec. has concentration of boron (B) of about $3\times 10^{21}$ $cm^{-3}$, the surface part of the substrate discharged for 100 sec. has concentration of boron (B) of about $5\times 10^{21}$ $cm^{-3}$.

The above-mentioned two cases show that the concentration of boron (B) become being not in direct proportion to the discharging time any more, and furthermore the inside of vacuum chamber 3 is kept at about $1\times 10^{-1}$ torr, and all other conditions are equal as above-mentioned. SIMS analysis data shows: the surface part of both substrates discharged for 10 sec. and 100 sec. have the same concentration of boron (B) of about $1\times 10^{22}$ $cm^{-3}$ as the previous examples. This shows that the (e.g. boron) concentration profile of the plasma doping becomes not adjustable through control of the total discharging time, under condition that the inside of the chamber is kept at more than $5\times 10^{-2}$ torr, because boron (B) starts to deposit on the surface of the Si substrate 4 under such pressure.

On the contrary, when pressure of the inside of the vacuum chamber 3 is kept at less than $1\times 10^{-3}$ torr, e.g. at $5\times 10^{-4}$ torr, and all other conditions are equal as above-mentioned, it becomes difficult to make plasma at the pressure, and the impurity doping on the surface part of the Si substrate 4 is not confirmed.

As has been described in the above-mentioned fourth embodiment, impurity concentration profile of the plasma doping is adjustable, without depositing of impurity on the substrate, by controlling the discharging time under the condition that the inside of the vacuum chamber 3 is kept at more than $1\times 10^{-3}$ torr, e.g. less than $5\times 10^{-2}$ torr.

EMBODIMENT 5

Figure 7:
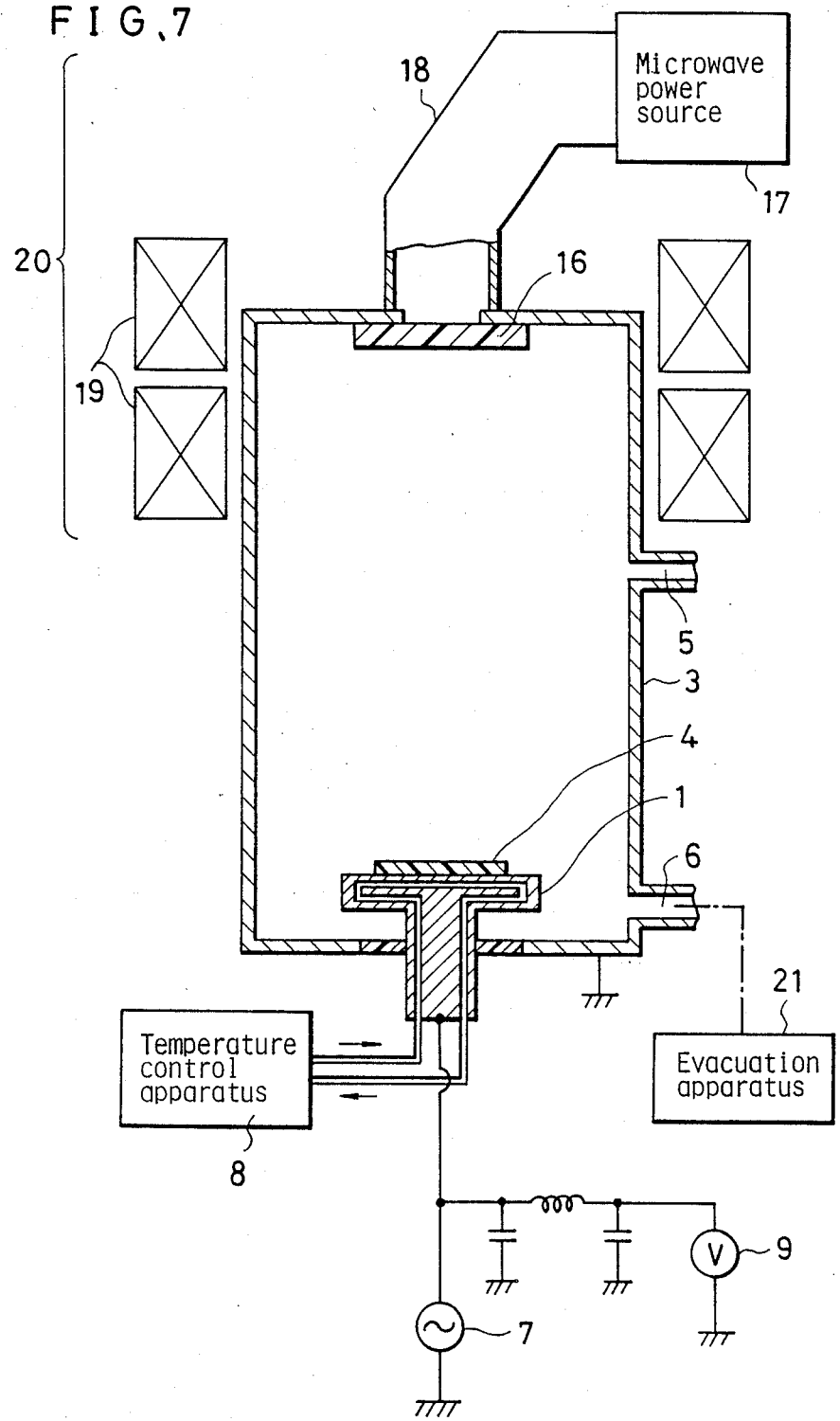
FIG. 7 is a sectional view showing a plasma doping apparatus of a fifth embodiment of the present invention.
Figure 8:
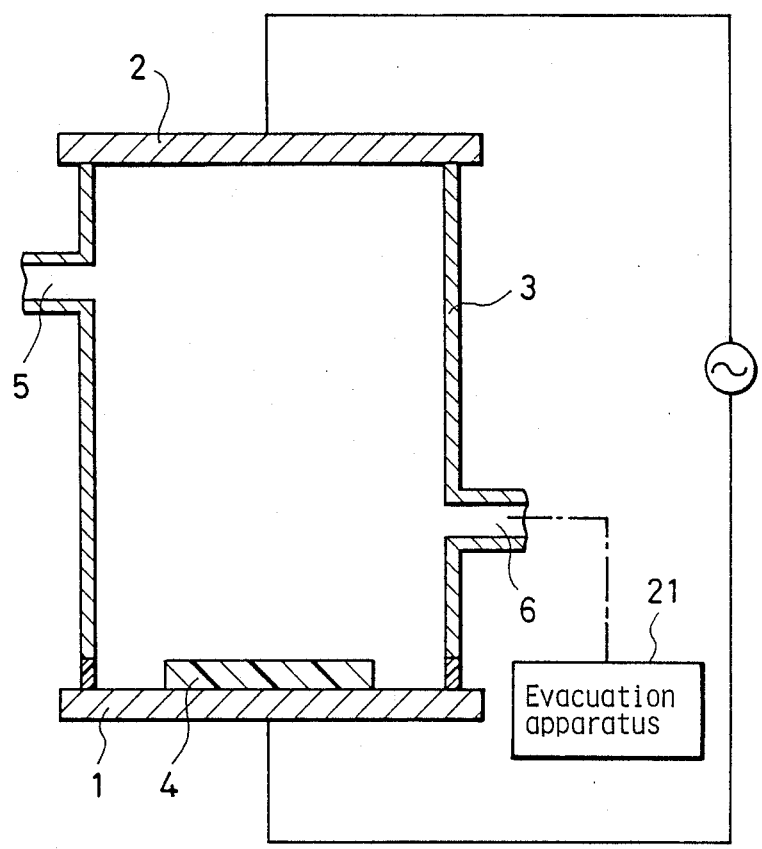
FIG. 8 is the sectional view showing a plasma doping apparatus of the prior art.

A fifth preferred embodiment of the present invention is elucidated hereafter with reference to FIG. 7. An apparatus used in this embodiment 5 is the same as the one used in the embodiment 1. Therefore, the same description as the first embodiment apply unless the differences mentioned below.

A vacuum chamber 3 has a gas inlet port 5 and a gas outlet port 6, and comprises a window seal plate of quartz glass 16, a lower electrode 1 therein. The lower electrode 1 is for supporting thereon the object substrate 4, for instance, a Si substrate, which is 6 inch in diameter, having deep trenches having width of pattern openings of 0.5 $\mu m$ and depth of 3 $\mu m$. The lower electrode 1 is thermally connected to a known temperature control apparatus 8, so that the temperature of the lower electrode 1 is controlled to be always at a constant temperature e.g. 20° C. The lower electrode 1 is further connected to an R. F. power source 7, which issues a radio frequency current of, for instance, 13.56 MHz. A volt meter 9 for measuring D.C. potential of the lower electrode 1 is connected through a known low-pass filter to the lower electrode 1. Behind the plate of quartz window glass 16 a known waveguide 18 is connected to a microwave power source 17, which issues a microwave into the vacuum chamber 3. A magnet 19 surrounding the vacuum chamber 3 makes electrons spin to results an ECR discharging from an ECR ion generator 20, which is the name of the system consists of the plate of quartz glass 16, waveguide 18, microwave power source 17, and magnet 19.

The operation of the plasma doping in the above-mentioned apparatus is as follows:

Mixed gas containing 95 vol % of He and 5 vol % of $B_2H_6$ wherein boron (B) is an impurity to be doped, is lead into the vacuum chamber 3. The inside of the vacuum chamber 3 is kept at about $5\times 10^{-4}$ torr, and intermittent R. F. power of about $-700$ V by the volt-meter 42 is fed, with two conditions, namely, the discharge time of 10 sec. or 100 sec.. At the same time, when the microwave power source 17 supplies microwave power at a rate of 300 W. A magnetic flux density caused by the magnet 19 is set at about 75[G] to enable to discharge from the ECR ion generator 20. SIMS analysis data shows that: when the total discharge tiem is 10 sec., the surface part of the substrate has concentration of boron (B) of about $1\times 10^{20}$ $cm^{-3}$; when the discharge time is 100 sec., the surface part of the substrate has concentration of boron (B) of about $1\times 10^{21}$ $cm^{-3}$; and furthermore the exposed surface formed in the deep trench has a uniform concentration of boron (B).

Furthermore, it is confirmed through this embodiment that: when the inside of the vacuum chamber 3 is kept in the range of $1\times 10^{-4}$-$5\times 10^{-3}$ torr, the ECR ion generator 20 makes a stable plasma, and a doping of boron on the surface part of the Si substrate 4 has good reappearance. A deposition of boron on Si substrate 4 is not shown in the range as above-mentioned. As the discharge time increases, amount of doped impurity increases, and it is proved that a use of photo resist is possible, because the deposition of boron which spoils the resist does not take place. When $AsH_3$ or $PH_3$ as gases including an impurity is used in place of $B_2H_6$, the same conclusion as above-mentioned is obtained. The radio frequency issued by the R. F. power source 7 in this embodiment is 13.56 MHz, but the R. F. power of lower frequency e.g. 800 KHz, is used in place, and the same results as above-mentioned are obtained also.

As has been described in the above-mentioned embodiment, impurity concentration profile of the plasma doping without deposit of the impurity on the substrate, is adjustable by controlling the discharging time with use of the radio frequency discharging and the ECR discharging with the condition that the inside of the vacuum chamber 3 is kept between $1 \times 10^{-4}$ torr and $5 \times 10^{-3}$ torr.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. Method for plasma-doping of impurity on a semiconductor substrate comprising the steps of:
    placing an object semiconductor substrate on a first electrode in a vacuum chamber,
    introducing a gas of a controlled reduced pressure containing at least one impurity, into said vacuum chamber,
    impressing a radio frequency current of a high voltage in intermittence across said first electrode and a second electrode in said chamber thereby causing radio frequency discharging in said chamber, to generate plasma doping, and
    controlling a duty ratio of said intermittence in accordance with a program to control the amount of impurity doped on a surface of said substrate.

2. Method for plasma-doping of impurity on a semiconductor substrate comprising the step of:
    placing an object semiconductor substrate on a first electrode in a vacuum chamber,
    introducing a gas of a controlled reduced pressure containing at least one impurity into said vacuum chamber, and
    impressing a radio frequency current of a high voltage in intermittence across said first electrode and said second electrode in said chamber, the frequency of said intermittence being 0.1 Hz to 50 Hz, thereby causing radio frequency discharging in said chamber to generate a plasma doping.

3. Method in accordance with claim 1, wherein said object substrate is on single-crystalline silicon, polycrystalline silicon or amorphous silicon.

4. Method in accordance with claim 1, wherein said impurity is boron, phosphorus or arsenide.

5. Method for plasma-doping of impurity on a semiconductor substrate comprising the steps of:
    placing an object semiconductor substrate on a first electrode in a vacuum chamber,
    introducing a gas of a controlled reduced pressure containing at least one impurity, into said vacuum chamber,
    impressing a radio frequency current of a high voltage across said first electrode and a second electrode in said chamber through means for measuring said radio frequency current, thereby causing radio frequency discharging in said chamber to generate a plasma, and
    controlling said radio frequency current based on a measurement thereof in accordance with a program, to control amount of impurity doped on the surface of said substrate.

6. Method in accordance with claim 5, wherein said object substrate is on single-crystalline silicon, polycrystalline silicon or amorphous silicon.

7. Method in accordance with claim 5, wherein said impurity is boron, phosphorus or arsenide.

8. Method for plasma doping of impurity of a semiconductor substrate comprising the steps of:
    placing an object semiconductor substrate on a first electrode in a vacuum chamber,
    introducing a gas of a pressure of from $1 \times 10^{-3}$ torr to $5 \times 10^{-2}$ torr containing at least one impurity, into said vacuum chamber,
    intermittently impressing a radio frequency current of a high voltage across said first electrode and a second electrode in said chamber, and
    controlling the impressed period of said current to contol the amount of impurity doped on a surface of said substrate.

9. Method in accordance with claim 8, wherein the surface of the objective substrate is of single-crystalline silicon and have trenches as electrodes of capacitor or isolation region.

10. Method for plasma-doping of impurity on a semiconductor substrate comprising the steps of:
    placing an object semiconductor substrate on a first electrode in a vacuum chamber,
    introducing a gas of a pressure of from $1 \times 10^{-4}$ torr to $5 \times 10^{-2}$ torr containing at least one impurity, into said vacuum chamber,
    intermittently impressing a radio frequency current of a high voltage across said first electrode and a second electrode in said chamber and microwave into said chamber thereby causing radio frequency discharging and electronic cyclotron resonance discharge in said chamber, to generate plasma doping, and
    controlling the impressed period of said current to control the amount of impurity doped on a surface of said substrate.

11. Method in accordance with claim 10, wherein said object semiconductor substrate is of single-crystalline silicon, polycrystalline silicon or amorphous silicon.

12. Method in accordance with claim 10, wherein said impurity is boron, phosphorus or arsenide.

13. Method in accordance with claim 10, wherein the surface of the objective substrate is of single-crystalline silicon and have trenches as electrodes of capacitor or isolation region.

14. Method for plasma-doping of impurity on a semiconductor substrate comprising the steps of:
    placing an object semiconductor substrate on a first electrode in a vacuum chamber.
    introducing a gas of a controlled reduced pressure containing at least one impurity, into said vacuum chamber, and
    impressing a radio frequency current of a high voltage in intermittence across said first electrode and a second electrode in said chamber thereby causing radio the frequency discharging in said chamber, frequency of said intermittence being changed to make plasma doping with depthwise modulated concentration in said semiconductor substrate.

* * * * *